United States Patent
Hershman et al.

(10) Patent No.: US 10,318,438 B1
(45) Date of Patent: Jun. 11, 2019

(54) SECURE MEMORY ACCESS USING MEMORY READ RESTRICTION

(71) Applicant: NUVOTON TECHNOLOGY CORPORATION, Hsin-chu (TW)

(72) Inventors: Ziv Hershman, Givat Shmuel (IL); Dan Morav, Herzliya (IL)

(73) Assignee: NUVOTON TECHNOLOGY CORPORATION, Hsin-Chu (TW)

( * ) Notice: Subject to any disclaimer, the term of this patent is extended or adjusted under 35 U.S.C. 154(b) by 0 days.

(21) Appl. No.: 15/834,087

(22) Filed: Dec. 7, 2017

(51) Int. Cl.
*G06F 12/14* (2006.01)
*G06F 9/4401* (2018.01)
*G11C 29/38* (2006.01)

(52) U.S. Cl.
CPC ........ *G06F 12/1441* (2013.01); *G06F 9/4401* (2013.01); *G06F 12/1433* (2013.01); *G06F 2212/1052* (2013.01); *G11C 29/38* (2013.01)

(58) Field of Classification Search
CPC .................. G06F 12/14; G06F 12/1416; G06F 12/1425–12/1441
See application file for complete search history.

(56) References Cited

U.S. PATENT DOCUMENTS

| | | | |
|---|---|---|---|
| 5,434,562 A | 7/1995 | Reardon | |
| 5,960,172 A | 9/1999 | Hwang | |
| 6,115,819 A | 9/2000 | Anderson | |
| 7,003,676 B1 | 2/2006 | Weber et al. | |
| 7,395,394 B2 * | 7/2008 | Federa | G06F 12/1425 711/163 |
| 7,712,131 B1 * | 5/2010 | Lethe | G06F 21/57 701/29.1 |
| 8,095,851 B2 * | 1/2012 | Diggs | G06F 11/1068 714/723 |
| 8,773,905 B1 * | 7/2014 | Radinski | G11C 16/26 365/185.03 |
| 9,483,422 B2 * | 11/2016 | Hadley | G06F 21/54 |
| 9,612,977 B2 | 4/2017 | Berenbaum et al. | |
| 9,619,647 B2 | 4/2017 | Rohleder et al. | |
| 9,959,421 B2 * | 5/2018 | Inamdar | H04L 43/0817 |
| 2001/0021120 A1 * | 9/2001 | Oowaki | G11C 7/20 365/145 |
| 2002/0095571 A1 * | 7/2002 | Bradee | G06F 21/6218 713/164 |
| 2002/0147924 A1 * | 10/2002 | Flyntz | G06F 21/32 726/4 |
| 2005/0024954 A1 * | 2/2005 | Dalvi | G06F 12/1433 365/199 |

(Continued)

*Primary Examiner* — Midys Rojas
*Assistant Examiner* — Khoa D Doan
(74) *Attorney, Agent, or Firm* — Kligler & Associates

(57) ABSTRACT

An apparatus includes a memory, an interface and read restriction logic. The read restriction logic is configured to receive via the interface a request to read a data value from a specified address of the memory, to retrieve the data value from the specified address, to check, upon finding that the specified address falls in an address range that is predefined as restricted, whether the retrieved data value belongs to a predefined set of permitted data values, to respond to the request with the retrieved data value when the retrieved data value belongs to the set of permitted data values, and, otherwise, when the retrieved data value does not belong to the set of permitted data values, to respond to the request with a dummy data value.

17 Claims, 2 Drawing Sheets

(56) References Cited

U.S. PATENT DOCUMENTS

| | | | |
|---|---|---|---|
| 2005/0188288 A1* | 8/2005 | Larson | G11C 29/08 714/718 |
| 2005/0193182 A1 | 9/2005 | Anderson et al. | |
| 2006/0250864 A1* | 11/2006 | Hartmann | G11C 29/18 365/201 |
| 2007/0005918 A1* | 1/2007 | Rothman | G06F 3/0619 711/163 |
| 2007/0034691 A1* | 2/2007 | Davis | G06Q 20/3278 235/382 |
| 2007/0237325 A1 | 10/2007 | Gershowitz et al. | |
| 2007/0266444 A1* | 11/2007 | Segal | G06F 21/554 726/27 |
| 2008/0005207 A1* | 1/2008 | Kumazawa | H04N 1/2137 |
| 2008/0094891 A1* | 4/2008 | Ho | G11C 11/5642 365/185.03 |
| 2008/0133796 A1* | 6/2008 | Gallagher | G06F 9/5016 710/52 |
| 2008/0151661 A1* | 6/2008 | Takai | G11C 29/028 365/201 |
| 2009/0055637 A1* | 2/2009 | Holm | G06F 21/575 713/1 |
| 2009/0113155 A1* | 4/2009 | Beals | G06F 12/1466 711/164 |
| 2010/0161927 A1* | 6/2010 | Sprouse | G06F 21/36 711/163 |
| 2011/0093700 A1* | 4/2011 | Mittal | G06F 12/1441 713/164 |
| 2011/0289137 A1* | 11/2011 | Ittah | G06F 12/0888 709/203 |
| 2012/0316803 A1* | 12/2012 | Simon | G01R 31/31851 702/58 |
| 2013/0019305 A1* | 1/2013 | Berenbaum | G06F 12/1408 726/19 |
| 2013/0262947 A1* | 10/2013 | Unno | G06F 11/004 714/746 |
| 2013/0304958 A1* | 11/2013 | Schoenfeldt | G06F 12/0223 710/264 |
| 2014/0137271 A1* | 5/2014 | Hyde | G06F 12/0238 726/30 |
| 2014/0281319 A1* | 9/2014 | Gupta | G06F 12/1441 711/163 |
| 2014/0289553 A1* | 9/2014 | Takano | G06F 11/1604 714/5.11 |
| 2015/0103598 A1* | 4/2015 | Tasher | G11C 16/22 365/185.04 |
| 2015/0301956 A1* | 10/2015 | Purkayastha | G06F 12/0868 711/129 |
| 2016/0300064 A1* | 10/2016 | Stewart | G06F 21/575 |
| 2017/0091122 A1* | 3/2017 | Gove | G06F 12/1416 |

* cited by examiner

# SECURE MEMORY ACCESS USING MEMORY READ RESTRICTION

FIELD OF THE INVENTION

The present invention relates generally to secure data storage, and particularly to methods and systems for secure memory access using memory read restriction.

BACKGROUND OF THE INVENTION

Various techniques are known in the art for securing access to sensitive information stored in memory. For example, U.S. Patent Application Publication 2007/0237325 describes a device having cryptographic capabilities, including a security system connected to a microcontroller block. The security system includes a non-volatile memory and a finite state machine. The finite state machine manages the device to maintain the content of an encryption key stored within the non-volatile memory secure, and to prevent access to the encryption key by a computer processing unit within the microcontroller block and/or an end user of the device.

SUMMARY OF THE INVENTION

An embodiment of the present invention that is described herein provides an apparatus including a memory, an interface and read restriction logic. The read restriction logic is configured to receive via the interface a request to read a data value from a specified address of the memory, to retrieve the data value from the specified address, to check, upon finding that the specified address falls in an address range that is predefined as restricted, whether the retrieved data value belongs to a predefined set of permitted data values, to respond to the request with the retrieved data value when the retrieved data value belongs to the set of permitted data values, and, otherwise, when the retrieved data value does not belong to the set of permitted data values, to respond to the request with a dummy data value.

In some embodiments, the apparatus further includes a controller configured to run a first software process, to permit the first software process to read any data value from the address range predefined as restricted, and permit a second software process, which runs in the processor after the first software process, to read the data values from the address range predefined as restricted only if the read data values belong to the set of permitted data values.

In some embodiments, the apparatus further includes a controller configured to perform a bootstrapping process, to disable external access to the memory while the bootstrapping process is in progress, and to activate the read restriction logic following the bootstrapping process.

In an embodiment, the read restriction logic is configured to receive the request from one of (i) a Built-In Self-Testing (BIST) module in the apparatus, and (ii) an external tester. In an example embodiment, the permitted data values include test values used for testing the memory. In a disclosed embodiment, the read restriction logic is configured to initiate a responsive action in response to detecting that (i) the specified address falls in the address range predefined as restricted, and that (ii) the retrieved data value does not belong to the set of permitted data values.

In an embodiment, upon failure of an alternative security mechanism, the read restriction logic is configured to permit readout of the data values from the address range predefined as restricted, only if the read data values belong to the set of permitted data values. In another embodiment, the read restriction logic is configured to respond to multiple reads from a same specified address with different dummy data values. In yet another embodiment, the apparatus includes an additional read restriction logic, which is configured to restrict access to an additional address range predefined as restricted, wherein the read restriction logic and the additional read restriction logic are controlled by different software layers.

There is additionally provided, in accordance with an embodiment of the present invention, a method including, in a device that includes a memory, receiving a request to read a data value from a specified address of the memory. The data value is retrieved from the specified address. Upon finding that the specified address falls in an address range that is predefined as restricted, a check is performed whether the retrieved data value belongs to a predefined set of permitted data values. When the retrieved data value belongs to the set of permitted data values, the request is responded to with the retrieved data value. Otherwise, when the retrieved data value does not belong to the set of permitted data values, the request is responded to with a dummy data value.

The present invention will be more fully understood from the following detailed description of the embodiments thereof, taken together with the drawings in which:

DETAILED DESCRIPTION OF EMBODIMENTS

Overview

Embodiments of the present invention that are described herein provide improved methods and systems for securing secret information stored in a memory. In particular, the disclosed techniques enable testing of a memory that stores secret information, without compromising testing quality or data security.

In some embodiments, a secure electronic device comprises a memory, in which a certain address range ("restricted address range") is designated for storage of secret information such as cryptographic keys. The device comprises a test interface, via which a tester issues write and read requests for testing the memory. Some of the read requests received via the test interface may specify addresses that fall within the restricted address range. Unless handled properly, serving such requests may lead to leakage of secret information.

In order to mitigate this security hazard, in some embodiments the device comprises read restriction logic, which monitors read requests arriving via the test interface and serves them selectively. Upon receiving a read request whose address falls in the restricted address range, the read restriction logic retrieves the requested data value and checks whether the data values belongs to a predefined set of permitted data values.

The permitted data values typically comprises a small set of data values (per data unit) that are used for testing and development. For example, for an 8-bit data unit (byte), 0x00, 0xAA and 0xFF hexadecimal values can be considered. The assumption is that legitimate test procedures will use these data values only. If the retrieved data value is one of the permitted values, the read restriction logic responds to the request with this data value. If not, the read restriction logic responds to the request with some dummy value.

When using this technique, if a series of read requests attempts to retrieve secret information, most of the retrieved data values will likely not belong to the set of permitted data values. As such, the read restriction logic will block these read requests and return dummy values instead. At the same time, legitimate read requests that are part of a genuine test procedure will not be blocked, since the data values they request will belong to the set of permitted data values. Typically, read requests that specify addresses outside the restricted address range are not blocked, regardless of the retrieved data values.

Example configurations of secure electronic devices that utilize the above-described read restriction technique are described herein. Some disclosed configurations use a secure boot process that initializes the read restriction logic.

System Description

Figure 1:
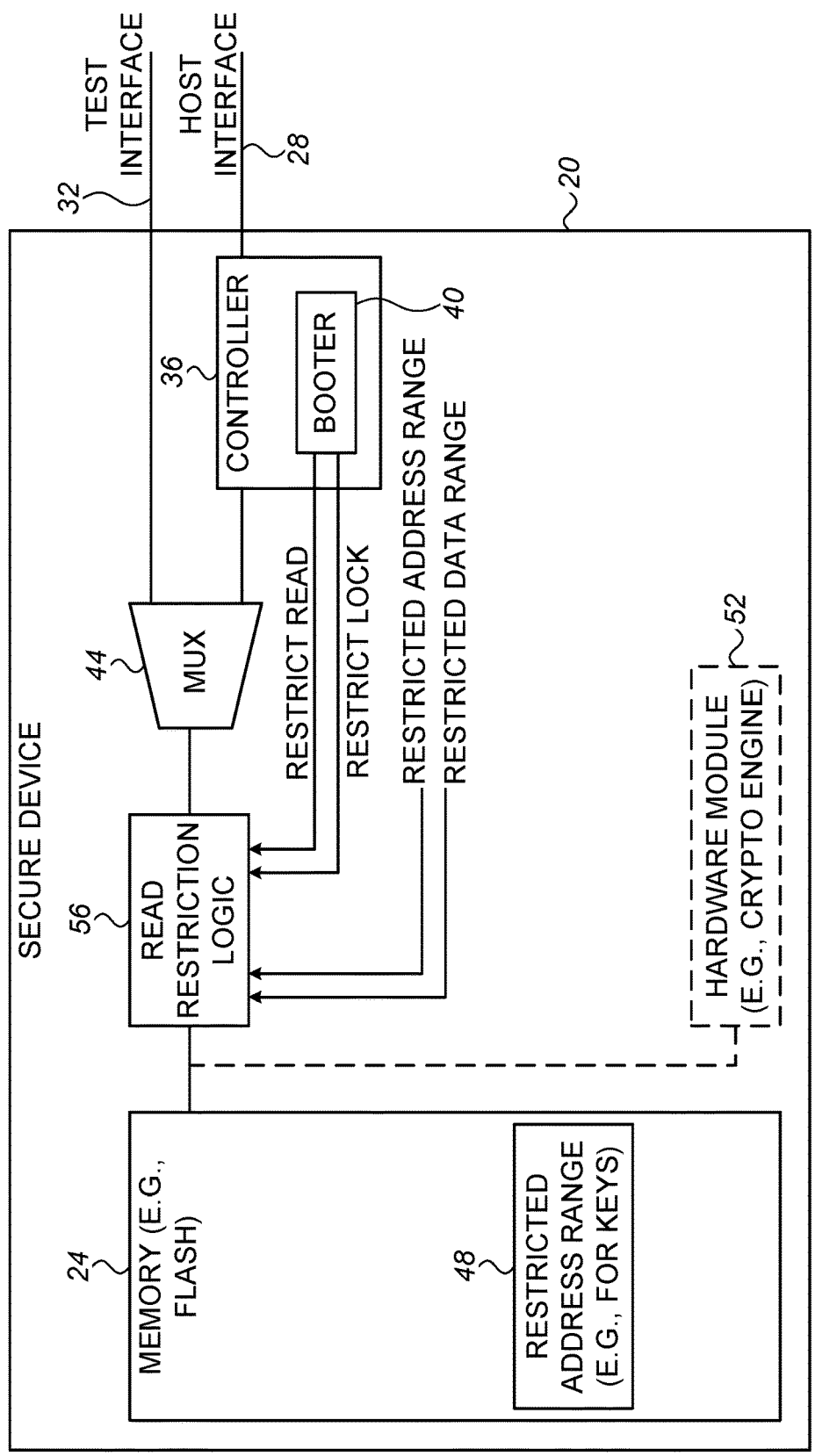
FIG. 1 is a block diagram that schematically illustrates a secure electronic device, in accordance with an embodiment of the present invention.

FIG. 1 is a block diagram that schematically illustrates a secure electronic device 20, in accordance with an embodiment of the present invention. Device 20 comprises a memory 24, e.g., a Non-Volatile Memory (NVM) comprising one or more Flash memory devices. Device 20 further comprises a controller 36, which manages the overall operation of the device, including storage of data in memory 24. Booter software 40, referred to simply as "boater," carries out a bootstrapping ("boot") process that boots controller 36, e.g., upon power-up or reset. At least the first part of the booter code typically resides in ROM or in another form of immutable storage, internal to device 20.

Device 20 may comprise any suitable type of electronic device having an internal NVM and a controller. One typical example is a security device. Several non-limiting examples of security devices include Trusted Platform Modules (TPMs), authentication Integrated Circuits (ICs) such as used to prevent counterfeit in printer cartridges, smart-cards, mobile-device Subscriber Identity Modules (SIMs), point-of-sale controllers, and many others.

In the present example, device 20 comprises two interfaces—A host interface 28 and a test interface 32. Host interface 28 is used by controller 36 for communicating with a host (not shown in the figure). The host uses interface 28 for communicating with device 20. For example, device 20 can be a Trusted Platform Module (TPM) and the host can communicate with it as defined by the Trusted Computing Group (TCG). In another example, device 20 can be a storage device which supports authentication with the host before allowing it to access at least a part of memory 24. If allowed, the host may use the host interface for sending data for storage in memory 24, and for retrieving previously-stored data from memory 24, but it can never have unrestricted read access to the restricted address range 48. Device 20 may use the restricted area, for example, for storing keys for authentication and self-protection.

Test interface 32 is used for testing device 20, including memory 24, and possibly other elements of the device. Test interface 32 is shown in the figure as an external interface, e.g., for connecting to an external tester or debug interface like JTAG or UART port. Additionally or alternatively, however, test interface 32 may be connected to an internal Built-In Self-Testing (BIST) module within device 20. A multiplexer (MUX) 44 connects interfaces 28 and 32 to memory 24 via read restriction logic 56.

In some embodiments, a certain address range 48, within the address space of memory 24, is predefined as restricted. This address range is used for storing secret information such as cryptographic keys. The information stored in address range 48 may be accessed by various elements, for example by a hardware module 52 (e.g., a cryptographic engine) or by booter 40 in controller 36.

In order to test memory 24 properly, it is typically desirable to allow access to the memory via test interface 32. In particular, it is desirable to allow access to restricted address range 48. Unless managed correctly, this sort of external access presents a severe security hazard. In some embodiments of the present invention, device 20 comprises read restriction logic 56, which protects the device from unauthorized access to restricted address range 48. The operation of read restriction logic 56 is addressed in detail below.

The configuration of device 20 shown in FIG. 1 is an example configuration that is depicted purely for the sake of conceptual clarity. In alternative embodiments, any other suitable configuration can be used. For example, memory 24 may comprise any other suitable type of volatile and/or non-volatile memory. As another example, the functionality of host interface 28 and test interface 32 may be combined in a single interface.

As yet another example, device 20 may comprise any other suitable types of hardware units 52 that access the information in restricted address range 48. In some embodiments, device 20 does not comprise a directly connected unit 52 at all. In some embodiments, in which there is no direct connection between memory 24 and hardware module 52, booter 40 may copy the relevant data from restricted address range 48 to the hardware module during boot time, e.g., into write-only registers.

In the example configuration of FIG. 1, hardware module 52 is connected to memory 24 directly (i.e., not via read restriction logic 56). This configuration, however, is not mandatory, and hardware modules may alternatively be connected to the memory via the read restriction logic. If a cryptographic engine is connected directly as in FIG. 1, certain limitations should be enforced:

Unrestricted data should not be exposed to the software of controller 36, to firmware or to any test or debug feature via the cryptographic engine.

The cryptographic engine can use the unrestricted data, but it should be guaranteed that the unrestricted data cannot be deduced from the outputs of the cryptographic engine.

Booter 40, and device 20 in general, should ensure that no unrestricted data is present in the cryptographic engine before entering a test mode that exposes the internals of the module (e.g., scan or observability tests). This condition can be satisfied, for example, by deleting the data prior to test mode enable, or by disabling test mode before the data enters the cryptography module.

Typically, the various elements of device 20 (e.g., memory 24, read restriction logic 56, hardware module 52, MUX 44 and/or controller 36), are fabricated such that it is all but impossible to separate them from one another and gain access to the interfaces between them. In an embodiment, the various elements of device 20 may be fabricated in the same Integrated Circuit (IC) package or on the same silicon die. Elements that are not mandatory for understanding of the disclosed techniques have been omitted from the figure for the sake of clarity.

In various embodiments, the different elements of device 20 shown in FIG. 1 may be implemented using any suitable hardware, such as in an Application-Specific Integrated Circuit (ASIC) or Field-Programmable Gate Array (FPGA). Alternatively, some of the functions of device 20, e.g., the functions of controller 36, may be implemented in software, or using a combination of software and hardware elements.

In some embodiments, controller 36 comprises a general-purpose processor, which is programmed in software to carry out the functions described herein. The software may be downloaded to the processor in electronic form, over a network or from a host, for example, or it may, alternatively or additionally, be provided and/or stored on non-transitory tangible media, such as magnetic, optical, or electronic memory.

Secure Memory Access Using Read Restriction

In some embodiments, read restriction logic 56 enables full testing of memory 24, including restricted address range 48, without compromising the security of any secret information stored therein at present or in the future.

In an embodiment, memory 24 is tested by writing certain data values to the memory, reading the data values from the memory, and verifying that the read data values match the written values. Typically, although not necessarily, the data values used for testing are chosen so as to toggle all the memory bits. For example, 8-bit data values such as 0x00, 0xFF, 0x55 and 0xAA may be suitable data values for testing.

In other words, the data values used for testing are typically drawn from a predefined, set of data values. The set of data values is typically small in the sense that it consists of much fewer data values than all possible data values of a given size. In the example above, which refers to 8-bit data values, only four data values (0x00, 0xFF, 0x55 and 0xAA) are used for testing, out of the 256 possible data value 0x00-0xFF. Note that data units other than 8-bit data units (e.g., 16-bit or 32-bit data units) can also be used.

In some embodiments, device 20 uses the fact that the data values used for testing are drawn from a predefined (and typically small) set of data values, to secure the secret information stored in memory 24.

In an embodiment, read restriction logic 56 is pre-configured with a set of data values used for testing. This set is also referred to as a "restricted data range" or "set of permitted data values"—all these terms are used interchangeably herein.

As can be seen FIG. 1, logic 56 is pre-configured (e.g., by controller 36) with (i) a definition of restricted address range 48 and (ii) a definition of the restricted data range, i.e., the set of permitted data values.

Upon receiving a request, via test interface 32, to read a data value from a specified address in restricted address range 48, read restriction logic 56 retrieves the data value in question and checks whether the retrieved data value is one of the permitted values used for testing. If so, logic 56 responds to the request by outputting the data value on test interface 32 as requested. If not, logic 56 responds to the request by outputting some dummy data value.

In this manner, normal testing can cover the entire address space of memory 24, including restricted range 48, as long as the data values that are written and read-back in the test procedure are all drawn from the set of permitted values. This sort of testing may be performed even when the memory contains secret information. If the read requests received over test interface 32 attempt to read any of the secret information, most of the retrieved data values will not belong to the set of permitted values, and will trigger logic 56 to respond with dummy data values. Thus, the risk of outputting secret information in any usable form on the test interface is effectively mitigated. In a possible embodiment, the secret information itself is formatted in a manner that does not comprise the "permitted values" used for testing.

The disclosed technique also enables full testing of the security functions of device 20, e.g., of a cryptographic engine or other hardware modules that access secret information in memory 24. In an example embodiment, controller 36 or an external tester may store one or more "test keys" in restricted address range 48. The test keys function similarly to normal secret keys, but are made-up of data values that belong to the restricted data range. Such keys can be read freely via test interface 32.

Note that, in an embodiment, logic 56 may be pre-configured with only some of the data values used for testing. For example, if the data values used for testing are 0x00, 0xFF, 0x55 and 0xAA, it is sufficient to pre-configure logic with only three of these data values (e.g., 0x00, 0xFF and 0xAA) and set the dummy data value to be the fourth data value (e.g., 0x55).

Figure 2:
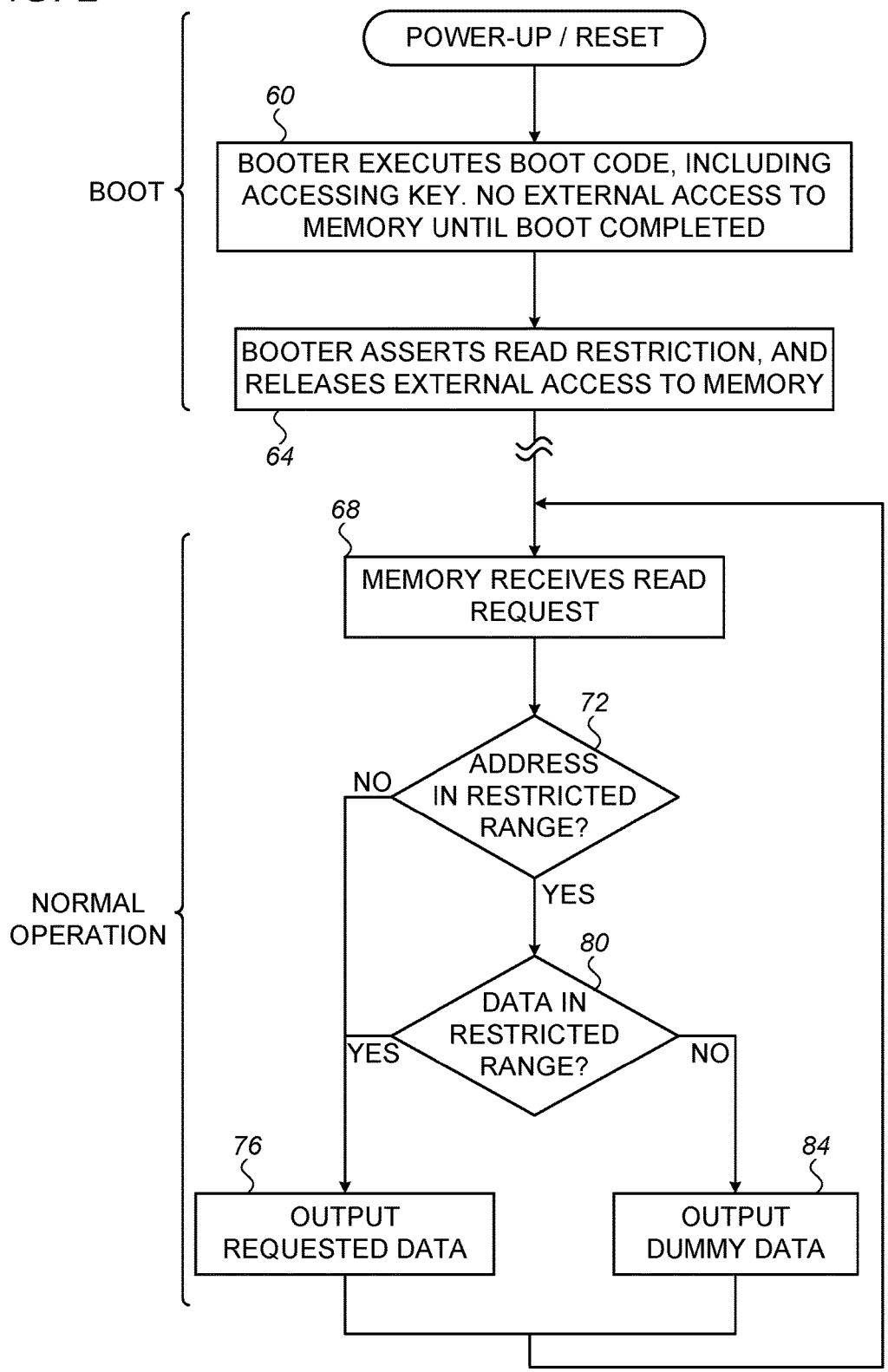
FIG. 2 is a flow chart that schematically illustrates a method for secure memory access using read restriction, in accordance with an embodiment of the present invention.

FIG. 2 is a flow chart that schematically illustrates a method for secure memory access using read restriction, in accordance with an embodiment of the present invention. The first portion of the flow chart (steps 60 and 64) describes the boot process of controller 36, and of device 20 as a whole. The second portion (steps 68-84) describes the normal mode of operation of device 20.

Note that the normal mode of operation supports both testing and normal read and write operations, without a need for switching into a dedicated test mode. Alternatively, if test disable protection is implemented by other means (e.g., by permanently disabling test features at production), the disclosed technique can be applied as a "second defense line" in case the device is illegitimately fooled into test enable mode or in case of malicious software penetration into the device.

The method begins, e.g., on power-up or reset, with booter 40 booting controller 36 by executing certain boot program code, at a boot step 60. As part of the boot process, booter 40 may access the secret information in restricted range 48 of memory 24, e.g., for verifying a signature that signs at least part of the boot program code, and/or to load secret keys into cryptography accelerators. As long as the boot process is in progress, booter 40 typically blocks access to memory 24 via interfaces 28 and 32.

Once the boot process is completed, booter 40 activates read restriction logic 56, at a restriction activation step 64. In the example of FIG. 1, booter 40 controls logic 56 using two signals denoted "restrict read" and "restrict lock." Asserting the "restrict read" signal activates logic 56, and asserting the "restrict lock" signal latches the "restrict read" signal, thereby irreversibly activating the restriction until next boot. After activating logic 56, booter 40 enables access to memory 24 via user interface 28 and test interface 32.

In an alternative embodiment, the functionality of the "restrict read" and "restrict lock" signals can be implemented using a single signal that performs both activation and locking. Typically, the numerical values of the restricted address range and the restricted data range are configurable and controlled by booter 40. When the boot process is about to be completed, or when test mode is about to be enabled, booter 40 typically locks these values for subsequent changes.

At this stage, before allowing processing of actual tests, controller 36 typically checks whether test mode is enabled or not. If not, test mode access is blocked until the next power cycle (e.g., power-up or reset). If test mode is enabled, the method may proceed. The above restriction (checking for test-mode enablement) may also be performed by firmware in device 20. In this case, restricting the read data to certain values may serve as a "second defense line" in scenarios in which the device is illegitimately caused to enable the test enable.

At some later point in time, during normal operation, device 20 receives a read request, e.g., on test interface 32, at a read request step 68. The read request specifies an address in memory 24 from which a data value is to be read. Logic 56 retrieves the data value from the specified address in memory 24.

At an address checking step 72, read restriction logic 56 checks whether the specified address belongs to restricted address range 48. If the specified address does not belong to restricted address range 48, logic 56 outputs the retrieved data value, e.g., on test interface 32, as requested, at a data output step 76. The method then loops back to step 68 above.

If the specified address belongs to restricted address range 48, logic 56 checks whether the retrieved data value is one of the permitted data values (the restricted data range), at a data checking step 80. If so, logic 56 outputs the retrieved data value as requested, at data output step 76. The method loops back to step 68.

If, however, logic 56 finds (at step 80) that the retrieved data value is not one of the permitted data values, logic 56 does not output the retrieved data value. Instead, logic 56 outputs a dummy data value, e.g., on test interface 32, at a dummy output step 84, and the method loops back to step 68 above. In case of a later power-up or reset event, the method restarts at step 60.

The method flow of FIG. 2 is an example flow, which is chosen for the sake of conceptual clarity. In alternative embodiments, the disclosed read restriction technique can be implemented using any other suitable flow.

In some embodiments, at step 84, logic 56 may choose the dummy data value from a set of multiple dummy values. The selection may be, for example, random. In other embodiments, logic 56 may output, for a given address, dummy data values that change from one read to another. In an example embodiment, logic 56 chooses the dummy data values as a deterministic function of the address, blended with a secret obfuscation key (e.g., using a lightweight encryption algorithm).

In some embodiments, at step 80, upon detecting an unauthorized attempt to read secret information from restricted range 48 via test interface 32, logic 56 may initiate a suitable responsive action. For example, logic 56 may interpret any non-valid read value as an attack attempt. Examples of responsive actions may comprise issuing an alert, shutting down some or all of device 20, blocking access to memory 24 or parts thereof, and/or erasing some or all of the secret information from memory 24.

In the embodiments described above, using the "restrict read" and "restrict lock" mechanism, controller 36 permits booter 40 to access restricted address range 48 during the boot process. For software processes that run later, the "restrict read" and "restrict lock" mechanism restricts the access to address range 48 to the predefined set of permitted test values.

Thus, in the present context, the term "restricted access" refers to read access that returns the actual data values stored in the specified addresses only if these data values belong to a predefined subset of permitted data values. Correspondingly, "unrestricted access" refers to read access that returns the actual data values stored in the specified addresses regardless of the data values.

Put more generally, in some embodiments controller 36 runs a first software process, permits the first software process to access the address range predefined as restricted, but allows only restricted access to the address range predefined as restricted to a second software process that runs in the processor after the first software process.

In some embodiments, memory 24 comprises multiple restricted address ranges 48, each associated with a respective read restriction logic 56. In this configuration, for example, each read restriction logic 56 can be controlled by a different software layer. In an example embodiment, the different software layers (each controlling a different read restriction logic 56 that is associated with a different restricted address range 48) are invoked sequentially in a layered boot process. One example of such software layers is described by England et al., in "RIoT—A Foundation for Trust in the Internet of Things," Microsoft Research Technical Report MSR-TR-2016-18, April, 2016. The cited paper describes a layered boot process having software layers denoted L0, L1, L2 and OS.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a memory;
an interface;
read restriction logic, which is configured to:
  receive via the interface a request to read a data value from a specified address of the memory;
  retrieve the data value from the specified address;
  upon finding that the specified address falls in an address range that is predefined as restricted, check whether the retrieved data value belongs to a predefined set of permitted data values;
  when the retrieved data value belongs to the set of permitted data values, respond to the request with the retrieved data value; and
  otherwise, when the retrieved data value does not belong to the set of permitted data values, respond to the request with a dummy data value; and
a controller configured to:
  run a first software process;
  permit the first software process to read any data value from the address range predefined as restricted; and
  permit a second software process, which runs in the processor after the first software process, to read the data values from the address range predefined as restricted only if the read data values belong to the set of permitted data values.

2. An apparatus, comprising:
a memory;
an interface; and
read restriction logic, which is configured to:
- receive via the interface a request to read a data value from a specified address of the memory;
- retrieve the data value from the specified address;
- upon finding that the specified address falls in an address range that is predefined as restricted, check whether the retrieved data value belongs to a predefined set of permitted data values;
- when the retrieved data value belongs to the set of permitted data values, respond to the request with the retrieved data value; and
- otherwise, when the retrieved data value does not belong to the set of permitted data values, respond to the request with a dummy data value; and a controller configured to perform a bootstrapping process, to disable external access to the memory while the bootstrapping process is in progress, and to activate the read restriction logic following the bootstrapping process.

3. The apparatus according to claim 1, wherein the read restriction logic is configured to receive the request from one of (i) a Built-In Self-Testing (BIST) module in the apparatus, and (ii) an external tester.

4. The apparatus according to claim 1, wherein the permitted data values comprise test values used for testing the memory.

5. The apparatus according to claim 1, wherein the read restriction logic is configured to initiate a responsive action in response to detecting that (i) the specified address falls in the address range predefined as restricted, and that (ii) the retrieved data value does not belong to the set of permitted data values.

6. An apparatus, comprising:
a memory;
an interface; and
read restriction logic, which is configured to:
- receive via the interface a request to read a data value from a specified address of the memory;
- retrieve the data value from the specified address; and
- upon failure of an alternative security mechanism:
  - upon finding that the specified address falls in an address range that is predefined as restricted, check whether the retrieved data value belongs to a predefined set of permitted data values;
  - when the retrieved data value belongs to the set of permitted data values, respond to the request with the retrieved data value; and
  - otherwise, when the retrieved data value does not belong to the set of permitted data values, respond to the request with a dummy data value.

7. The apparatus according to claim 1, wherein the read restriction logic is configured to respond to multiple reads from a same specified address with different dummy data values.

8. The apparatus according to claim 1, and comprising an additional read restriction logic, which is configured to restrict access to an additional address range predefined as restricted, wherein the read restriction logic and the additional read restriction logic are controlled by different software layers.

9. A method, comprising:
in a device that comprises a memory, receiving a request to read a data value from a specified address of the memory;
retrieving the data value from the specified address;
upon finding that the specified address falls in an address range that is predefined as restricted, checking whether the retrieved data value belongs to a predefined set of permitted data values;
when the retrieved data value belongs to the set of permitted data values, responding to the request with the retrieved data value;
otherwise, when the retrieved data value does not belong to the set of permitted data values, responding to the request with a dummy data value;
running a first software process;
permitting the first software process to read any data value from the address range predefined as restricted; and
permitting a second software process, which runs after the first software process, to read the data values from the address range predefined as restricted only if the read data values belong to the set of permitted data values.

10. A method, comprising:
in a device that comprises a memory, receiving a request to read a data value from a specified address of the memory;
retrieving the data value from the specified address;
upon finding that the specified address falls in an address range that is predefined as restricted, checking whether the retrieved data value belongs to a predefined set of permitted data values;
when the retrieved data value belongs to the set of permitted data values, responding to the request with the retrieved data value; and
otherwise, when the retrieved data value does not belong to the set of permitted data values, responding to the request with a dummy data value; and
performing a bootstrapping process, disabling external access to the memory while the bootstrapping process is in progress, and activating checking of the specified address and of the retrieved data value following the bootstrapping process.

11. The method according to claim 9, wherein receiving the request comprises accepting the request from one of (i) a Built-In Self-Testing (BIST) module in the apparatus, and (ii) an external tester.

12. The method according to claim 9, wherein the permitted data values comprise test values used for testing the memory.

13. The method according to claim 9, and comprising initiating a responsive action in response to detecting that (i) the specified address falls in the address range predefined as restricted, and that (ii) the retrieved data value does not belong to the set of permitted data values.

14. The method according to claim 9, and comprising, upon failure of an alternative security mechanism, permitting readout of the data values from the address range predefined as restricted, only if the read data values belong to the set of permitted data values.

15. The method according to claim 9, wherein responding to the request comprises responding to multiple reads from a same specified address with different dummy data values.

16. The method according to claim 9, and comprising restricting access to the address range predefined as restricted, and to an additional address range predefined as restricted, under control of different software layers.

17. A method, comprising:
in a device that comprises a memory, receiving a request to read a data value from a specified address of the memory;
retrieving the data value from the specified address; and upon failure of an alternative security mechanism:
- upon finding that the specified address falls in an address range that is predefined as restricted, checking whether the retrieved data value belongs to a predefined set of permitted data values;
- when the retrieved data value belongs to the set of permitted data values, responding to the request with the retrieved data value; and
- otherwise, when the retrieved data value does not belong to the set of permitted data values, responding to the request with a dummy data value.

* * * * *